United States Patent [19]
Anzai

[11] Patent Number: 6,038,125
[45] Date of Patent: Mar. 14, 2000

[54] ELECTRONIC DEVICE WITH INTERLOCKING FEATURE FOR MOUNTING A REMOVABLE ELECTRONIC PACKAGE

[75] Inventor: Toshiaki Anzai, Kawasaki, Japan

[73] Assignee: Fujitsu Limited, Kawasaki, Japan

[21] Appl. No.: 09/030,356

[22] Filed: Feb. 25, 1998

[30] Foreign Application Priority Data

Jul. 22, 1997 [JP] Japan .................................... 9-196082

[51] Int. Cl.$^7$ .................................................. H02B 11/12

[52] U.S. Cl. .......................... 361/609; 361/615; 361/616; 361/683; 361/726; 361/727; 174/65 R; 174/67; 439/142; 312/223.2; 220/242; 220/254; 220/255

[58] Field of Search .................................... 361/609, 616, 361/726, 683–686, 732, 740, 747, 759, 801; 174/67, 65 R; 220/241, 254, 255; 312/223.1; 70/77, 83, 88; 439/953, 142

[56] References Cited

U.S. PATENT DOCUMENTS 5,574,625  11/1996  Ohgami et al. ......................... 361/684
5,757,616   5/1998  May et al. .............................. 361/683
5,949,652   9/1999  McAnally et al. ..................... 361/726

Primary Examiner—Leo P. Picard
Assistant Examiner—Boris L. Chervinsky
Attorney, Agent, or Firm—Armstrong, Westerman, Hattori, McLeland & Naughton

[57] ABSTRACT

The electronic device comprises a casing, an insertion port through which an electronic package is inserted in the casing, a power input inlet which is provided in the casing for connection to a power input cord, and a protection member capable of moving between a first position in which it opens the insertion port and blocks the inlet and a second position in which it blocks the insertion port and opens the inlet. The protection member comprises a first portion capable of blocking the insertion hole, a second portion capable of blocking the power input inlet, and a pivotable supporting portion between the first and second portions. The insertion hole can be covered by an closure having an end projection engageable with the protection member.

14 Claims, 4 Drawing Sheets

ELECTRONIC DEVICE WITH INTERLOCKING FEATURE FOR MOUNTING A REMOVABLE ELECTRONIC PACKAGE

BACKGROUND OF THE INVENTION

1. Field of the Invention

The present invention relates to an electronic device to which an electronic package, including, for example, a printed circuit board, can be removably mounted.

2. Description of the Related Art

An electronic device such as a personal computer or the like permits the user to mount or replace an electronic package such as a printed circuit board or the like, so that the system can be expanded or modified. Therefore, the case of the electronic device is provided with an insertion port for inserting the electronic package in the case. Furthermore, a power input cord can be connected to the electronic device. The power input cord has a plug which can be plugged into a power input inlet provided in the case.

The electronic package may be broken if it is removed from or mounted to the device while the power input cord is connected to the electronic device and the power switch of the electronic device is turned on. Therefore the power switch of the electronic device must be turned off before removing or mounting the electronic package. The user's manual of the electronic device should contain a warning that the power source must be turned off when the electronic package is to be removed or mounted. However, the user may carelessly remove or mount the electronic package while the power source is turned on.

Therefore, it is desired to employ a constitution which does not permit the electronic package to be removed or mounted unless the power cord is disconnected from the electronic device, in order that the electronic package will not be damaged even if the user removes the electronic package with the power switch being turned on.

Japanese Unexamined Patent Publication (Kokai) No. 61-61496 discloses an interlocking mechanism which does not permit the electronic package to be removed from or mounted to the electronic device if the power cord is connected to the electronic device. This interlocking mechanism includes a bell crank that is moved by a plug connected to the power cord.

When the plug is not fitted to the power input inlet, the bell crank is at a rest position and is not engaged with the electronic package, permitting the electronic package to be mounted on, or removed from, the electronic device. When the plug is fitted to the power input inlet, the bell crank is brought into an operative position. At the operative position, the bell crank protrudes into the case through an opening in the side wall of the case of the electronic device, and receives an end of the electronic package when it is inserted in the electronic device, to prevent electronic package from being coupled to a related electronic part (e.g., connector) in the electronic device.

The interlocking mechanism also includes a locking rod arranged in the electronic package. The electronic package has a rectangular parallelepiped shape having longest sides, next longest sides and shortest sides, in which the longest sides are arranged in a horizontal direction of the electronic device, the next longest sides are arranged in a vertical direction of the electronic device, and the shortest sides are arranged in the direction of depth of the electronic device. Therefore, the package-accommodating portion of the electronic device is a wide and shallow cavity. The locking rod is arranged in parallel with the longest side of the electronic package, i.e., arranged in the horizontal direction in parallel with the surface of the electronic device.

The opening in the side wall of the case of the electronic package and the opening in the side wall of the electronic device are coaxially arranged on the axis of the locking rod. In the state where the electronic package is disposed at a predetermined position in the electronic device and the plug of the power cord is fitted in the power input inlet, the bell crank passes through the opening in the side wall of the case of the electronic device and pushes the locking rod, so that the locking rod enters the opening in the side wall of the case of the electronic package on the side opposite to the bell crank and into the opening in the side wall of the electronic device, whereby the electronic package is locked in the case of the electronic device. When the plug is removed from the power input inlet, the bell crank moves to the rest position, so that the locking rod is retracted into the electronic package under the bias of a spring, whereby the locking is released permitting the electronic package to be taken out from the electronic device.

In the above-mentioned conventional interlocking mechanism, the bell crank is located in the casing of the electronic device and cannot be clearly seen by the operator. Therefore, the user who does not know that the bell crank is at the operative position may try to forcibly insert the electronic package in the electronic device, causing the electronic package to be damaged. Also, the plug moves the bell crank relying upon the cam action, and a large force is required for inserting the plug. Besides, since the locking rod is arranged inside the electronic package, it is not possible to use a conventional electronic package without such a locking rod. Moreover, a limitation is imposed on the direction for inserting the electronic package.

SUMMARY OF THE INVENTION

It is therefore an object of the present invention to solve the above-mentioned problems and to provide an electronic device which does not permit the electronic package to be removed or mounted unless the power cord is disconnected from the electronic device.

The electronic device according to the present invention comprises a casing, an insertion port through which an electronic package is inserted in said casing, a power input inlet provided in said casing for connection to a power input cord, and a protection member movable between a first position in which it opens said insertion port and blocks said inlet and a second position in which it blocks said insertion port and opens said inlet.

In this arrangement, when the protection member is at the first position, the power input inlet is blocked and, hence, the power input cord must have been disconnected from the power input inlet and it is not possible to insert the power input cord in the power input inlet, and in addition, the operator can clearly see this situation. It is, therefore, possible to insert the electronic package through the insertion port and to dispose it in the case, in the state where the power cord has been disconnected from the power input inlet. When the electronic package is disposed in the case, the protection member is moved to the second position, and the power input cord can be fitted in the power input inlet. In this state, the protection member at least partly blocks the insertion port, and, hence, the protection member prevents the electronic package from being taken out from the case, and the operator can visually recognize that the electronic package should not be taken out from the case. To take out the package from the case, the protection member must be moved from the second position to the first position and, hence, the power input cord must be disconnected from the power input inlet.

According to a preferred constitution, a plug connected to the power input cord is permitted to be fitted in said power input inlet when said protection member is at said second position, and said protection member is inhibited by said plug from moving from said second position to said first position when said protection member is at said second position.

Furthermore, said case has a surface to which said insertion port and said power input inlet are opened, and said protection member is arranged on said surface and is pivotable about a first axis substantially perpendicular to a line connecting the center of said insertion port to the center of said power input inlet.

The protection member is formed as an angular member comprising a first portion capable of blocking said insertion port, a second portion capable of blocking said power input Inlet, and a pivotable support portion located between said first portion and said second portion for pivotally supporting said protection member about said first axis.

The electronic device further includes a closure which is pivotable about a second axis perpendicular to said first axis, and is able to open or close said insertion port.

Moreover, said closure has a projection that comes into contact with said protection member, and said projection inhibits said protection member from moving from the first position to the second position when said closure is closing said insertion port and permits said protection member to move from the first position to the second position when said closure is opening said insertion port.

The electronic device further includes a mechanism for discharging the electronic package from said case when said protection member is moved from said second position to said first position.

The invention further provides a device comprising a casing having a surface, a first opening provided in the surface of said casing, a second opening provided in the surface of said casing, a protection member movable between a first position in which it opens said first openings and blocks said second opening and a second position in which it blocks said first opening and opens said second opening, and a closure capable of opening or closing said first opening.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
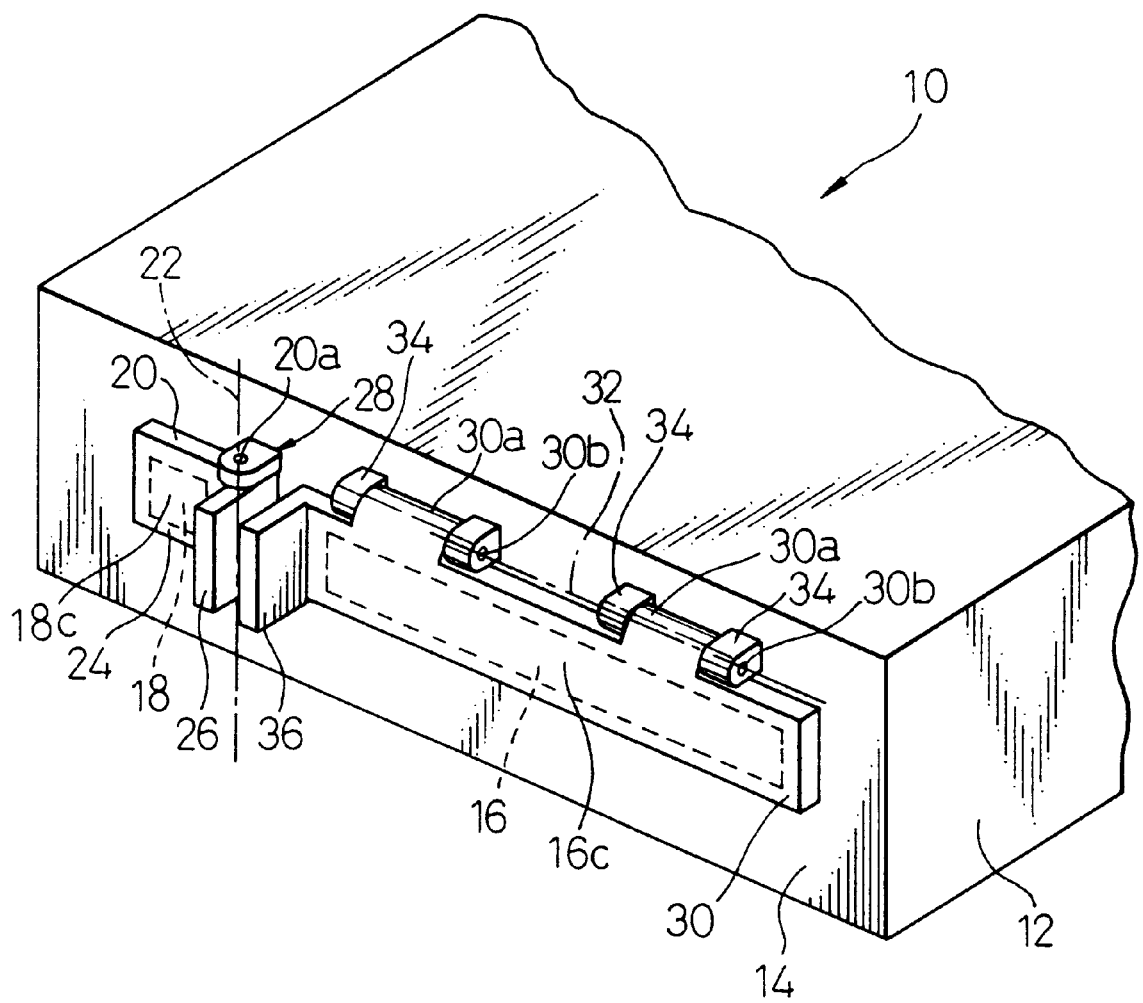
FIG. 1 is a perspective view illustrating an electronic device according to the first embodiment of the present invention.

FIGS. 1 to 4 illustrate an electronic device 10 according to the first embodiment of the present invention. The electronic device 10 has a casing 12 in which electric/electronic parts (not shown) that are necessary for a personal computer are arranged. An insertion port 16 and a power input inlet 18 are provided in the surface 14 of the casing 12. The insertion port 16 is provided for insertion of an electronic package 40 such as a printed circuit board or the like, and is formed in a horizontally elongated shape along the surface 14 of the case 12. The power inlet input inlet 18 is for connection to a power inlet cord 50 and is formed in the surface of the case 12 neighboring the insertion port 16.

A protection member 20 is disposed on the surface 14 of the case 12 between the insertion port 16 and the power input inlet 18. The protection member 20 is pivotable about a first axis 22 (which is vertical in FIG. 1) substantially perpendicular to a line connecting the center 16c of the insertion port 16 to the center 18c of the power input inlet 18. The protection member 20 is constituted by an angular plate member having an L-shape in cross section, and comprises a first portion 24 capable of at least partly blocking the insertion port 16, a second portion 26 capable of at least partly blocking the power input inlet 18, and a pivotable support portion 28 located between the first portion 24 and the second portion 26 for pivotally supporting the protection member 20 about the first axis 22. The pivotable support portion 28 comprises a bearing which rotatably supports a shaft 20a that protrudes from the protection member 20, and is secured to the casing 12.

Therefore, the protection member 20 is allowed to move between a first position in which it opens the insertion port 16 and blocks the inlet 18 and a second position in which it blocks the insertion port 16 and opens the inlet 18.

Moreover, the electronic device 10 is equipped with a closure 30 which is disposed neighboring the protection member 20 and can open or close the insertion port 16. The closure 30 is pivotally supported by a pivotable support portion 34 about a second axis 32 (horizontal in FIG. 1) which is perpendicular to the first axis 22. The pivotable support portion 34 comprises a bearing which pivotally supports a shaft 30b that protrudes from a portion of the closure 30, and is secured to the casing 12.

The closure 30 comprises a generally flat plate member capable of completely or partly covering the insertion port 16, and has a projection 36 on the side neighboring the protection member 20. The projection 36 is a plate arranged in parallel with the second portion 26 of the protection member 20, and comes into contact with the protection member 20, when the protection member 20 is in the closed state as shown in FIG. 1, in order to prevent the protection member 20, from moving to from the first position the second position. At its closed position, therefore, the closure 30 covers the insertion port 16 so that the interior of the electronic device will not be exposed through the insertion port 16 and that the printed circuit board cannot be inserted or removed. When the closure 30 is closed, the protection member 20 is locked at the first position to close the inlet 18. Therefore, the power input cord is prevented from being inserted.

Figure 2:
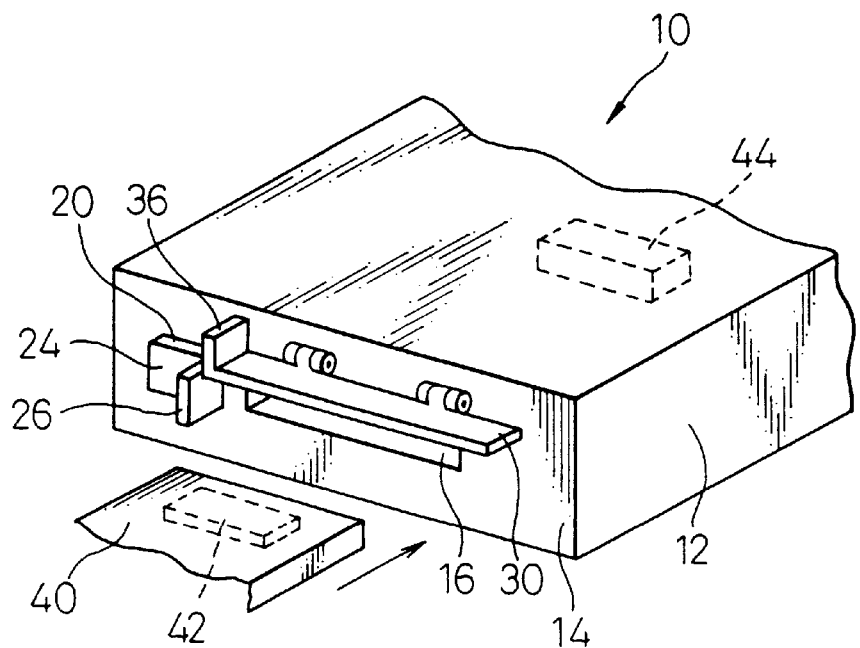
FIG. 2 is a perspective view illustrating the electronic device of FIG. 1 when the electronic package is inserted.

FIG. 2 illustrates an electronic package 40 inserted into the electronic device 10. The electronic package 40 includes a printed circuit board (not shown) and a connector 42. A connector 44 is disposed in the electronic device 10, the connector 44 being plugged into the connector 42 when the electronic package 40 is inserted. The closure 30 is opened when the electronic package 40 is inserted in the electronic device 10, but the protection member 20 must be at the first position where it closes the power input inlet 18 to insert the electronic package 40 in the insertion port 16. Therefore, the power input cord must be disconnected from the power input inlet 18, and this fact is clearly and visually recognized by the operator.

Figure 3:
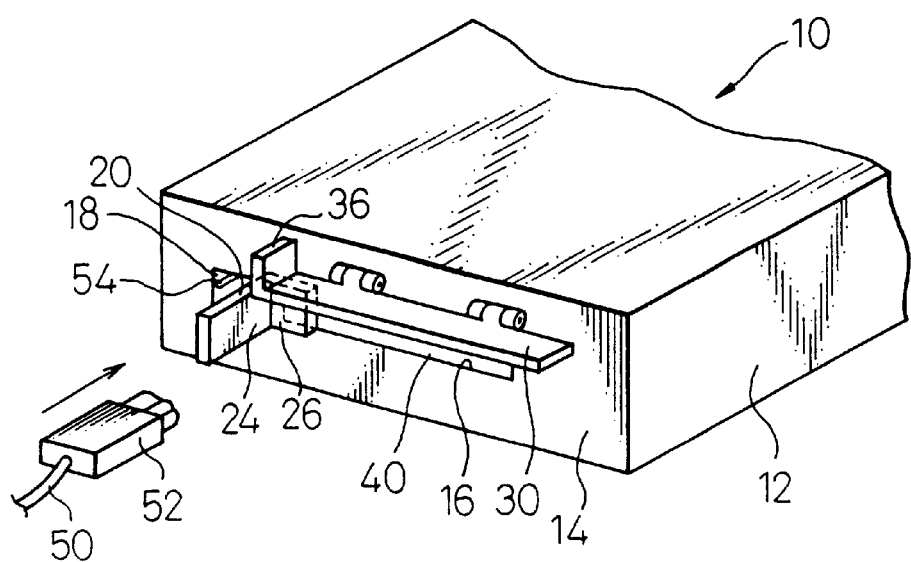
FIG. 3 is a perspective view illustrating the electronic device of FIG. 1 when the power input cord is connected.

FIG. 3 illustrates that the power input cord 50 is inserted in the power input inlet 18 after the electronic package 40 is inserted in the electronic device 10. The power input cord 50 has a plug 52 at its end, and the power input inlet 18 is formed as a cavity that suitably fits to the end portion of the plug 52 and has conducting portions (pins) 54 that fit to the conducting portions of the plug 52.

When the power input cord 50 is inserted in the power input inlet 18 after the electronic package 40 is inserted in the electronic device 10, the protection member 20 must be moved from the first position to the second position, and if the closure 30 is opened, the protection member 20 can be moved to the second position. Therefore, the power input inlet 18 is opened, enabling the power input cord 50 to be inserted in the power input inlet 18.

Figure 4:
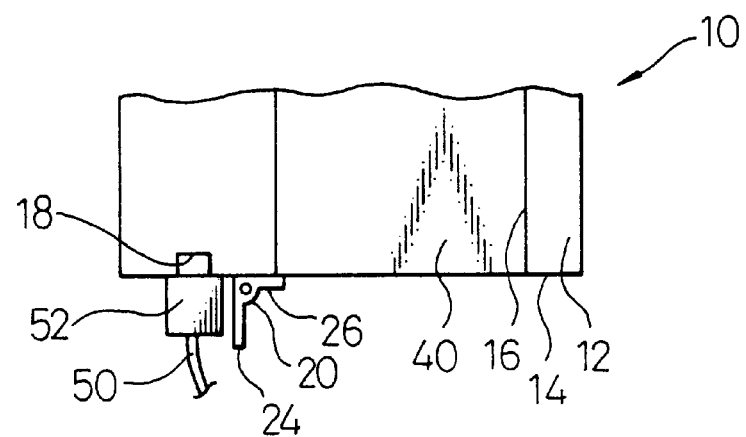
FIG. 4 is a diagrammatic view illustrating the electronic device of FIG. 1 after the power input cord is connected.

Referring to FIGS. 3 and 4, when the electronic package 40 is completely inserted in the casing 12, the rear surface of the electronic package 40 is positioned flush with (or on the further inner side of) the surface 14 of the casing 12. Therefore, the second portion 26 of the protection member 20 blocks the insertion port 16 and holds the rear surface of the electronic package 40. The first portion 24 of the protection member 20 stands near the plug 52 approximately parallel to the plug 52, so that, the protection member 20 is inhibited from being moved from the second position to the first position since the first portion 24 comes into contact with the plug 52. Therefore, the second portion 26 of the protection member 20 partly blocks the insertion portion 16 and is held at the second position, so the electronic package 40 cannot be pulled out from the case 12 since the second portion 26 of the protection member 20 comes into contact with the electronic package 40 when the power cord 50 is inserted in the power input inlet 18. In the state where the cord 50 is plugged in the power input inlet 18, furthermore, the second portion 26 of the protection member 20 blocks the insertion port 16, and the electronic package 40 cannot be inserted in the insertion port 16 even if an attempt is made to insert it therein.

To pull out the electronic package 40 from the case 12 in the state shown in FIG. 4, the power input cord 50 must be first pulled out from the power input inlet 18, and the protection member 20 must be moved from the second position to the first position. When the protection member 20 is thus moved, the electronic package 40 is no longer blocked by the second portion 26 of the protection member 20 and can be pulled out from the electronic device 10. In this case too, it is not possible to take out the electronic package 40 from the case 12 if the power input cord 50 is inserted in the power input inlet 18. Thus, the electric power is reliably shut off at the time of mounting or removing the electronic package 40.

The electronic device according to this embodiment comprises the casing 12, the insertion port 16 through which the electronic package 40 is inserted in the casing 12, the power input inlet 18 which is provided in the casing 12 and to which the power input cord 50 is connected, and the protection member 20 capable of moving between the first position in which it opens the insertion port 16 and blocks the inlet 18 and the second position in which it blocks the insertion port 16 and opens the inlet 18. Therefore, it is not possible to remove or mount the electronic package 40 unless the power cord 50 is disconnected from the electronic device 10. Therefore, the electronic package 40 is prevented from being damaged by being removed or mounted while electric power is supplied.

When the protection member 20 is at the second position, the plug 52 connected to the power input cord 50 can be fitted in the power input inlet 18 and prevents the protection member 20 from being moved from the second position to the first position. In the state where the power input cord 50 is connected, therefore, the protection member 20 is reliably maintained at the second position, inhibiting the electronic package 40 from being mounted or removed.

The casing 12 has the surface 14 to which the insertion port 16 and the power input inlet 18 are opened, and the protection member 20 is arranged on the surface 14 and is permitted to pivot about the first axis 22 substantially perpendicular to a line connecting the center of the insertion port 16 to the center of the power input inlet 18. The protection member 20 can be of a very simple structure which is provided on the surface 14 of the case 12. The operator can visually confirm whether the protection member 20 is at the first position or at the second position and can, hence, learn whether the electronic package 40 can be mounted or removed.

The protection member 20 is formed as the angular member comprising the first portion 26 capable of blocking the insertion port 16, the second portion 24 capable of blocking the power input inlet 18, and the pivotable support portion 28 located between the first portion 26 and the second portion 24 for pivotally supporting the protection member 20 about the first axis 22. As described above, therefore, either the first portion 26 or the second portion 24 selectively blocks the insertion port 16 or the power input inlet 18, and the other one of the first portion 26 or the second portion 24 comes into contact with the other member (closure 30 or power input cord 50) to prevent the protection member 20 from being turned undesirably.

The electronic device 10 further includes the closure 30 which is pivotable about the second axis 32 perpendicular to the first axis 22, and can open or close the insertion port 16. When the electronic package 40 has not been inserted in the electronic device 10, therefore, the insertion port 16 is closed by the closure 30.

The closure 30 has a projection 36 that comes into contact with the protection member 20, and the projection 36 inhibits the protection member 20 from moving from the first position to the second position when the closure 30 is closing the insertion port 16 and permits the protection member 20 to move from the first position to the second position when the closure 30 is opening the insertion port 16. Therefore, the power input cord 50 can be connected after the closure 30 is opened and the electronic package 40 is mounted.

Moreover, the device according to the embodiment comprises the casing 12, the first opening 16 provided in the surface 14 of the casing 12, the second opening 18 formed in the surface 14 of the casing 12, the protection member 20 capable of moving between the first position in which it opens the first opening 16 and blocks the second opening 18 and the second position in which it blocks the first opening 16 and opens the second opening 18, and the closure 30 capable of opening or closing the first opening 16. According to this constitution, when the closure 30 is closing the first opening 16, the protection member 20 is at the first position to block the second opening 18. When the closure 30 opens the first opening 16, an article can be inserted in the device through the first opening 16. After the article is inserted, the protection member 20 is moved to the second position to block the first opening 16, and the second opening 18 is opened. It is therefore allowed to insert the article in the device through the second opening 18. In the state where the protection member 20 is at the second position, the article cannot be inserted or taken out through the first opening 16. To insert or take out the article through the first opening 16, the protection member 20 must be moved from the second position to the first position. This constitution is particularly effective for a device which must not permit the article to be inserted or taken out through the first opening 16 having the closure in the state where the second opening 18 without the closure is closed.

Figure 7:
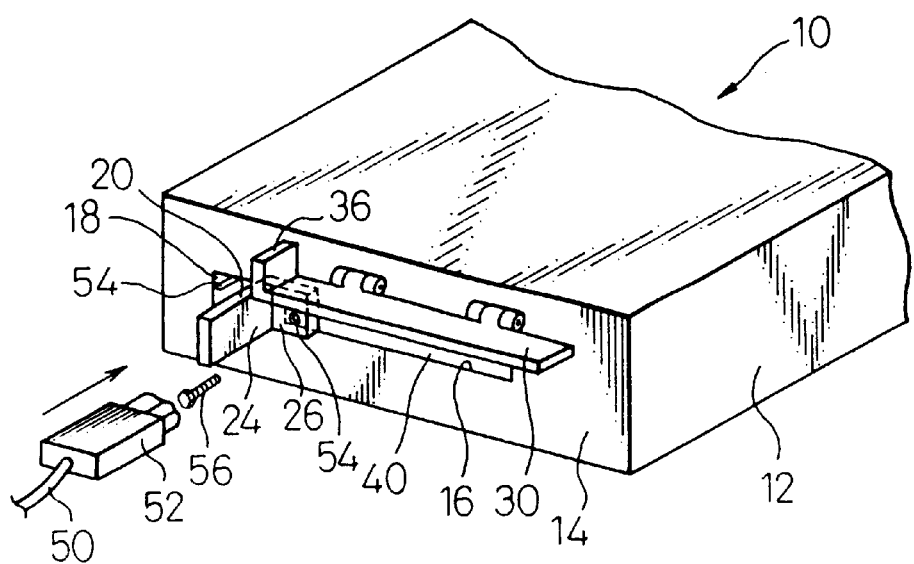
FIG. 7 is a view illustrating a modified example in the same state as that of FIG. 3.

FIG. 7 illustrates a modified example in the same state as that of FIG. 3. In this example, a hole 54 is formed in the second portion 26 of the protection member 20, and the electronic package 40 is also provided with a threaded hole at a position corresponding to the hole 54. In the state where the electronic package 40 is inserted in the electronic device 10 and the protection member 20 is brought into the second position, the hole 54 and the threaded hole in the package are in alignment. By inserting a screw 56 into the hole 54 and by tightening it, the electronic package 40 is fastened to the second portion 26 of the protection member 20. This brings about the same operation as the one mentioned above, and the electronic package 40 and the protection member 20 can be fastened together. Moreover, the electronic package 40 that is inserted can be visually recognized upon tightening the screw.

Figure 5:
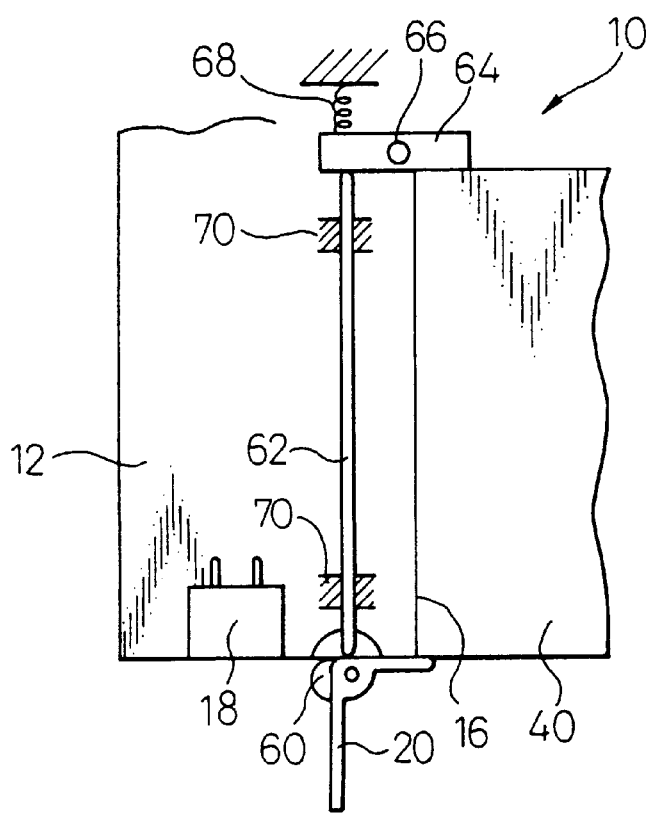
FIG. 5 is a diagrammatic view illustrating the electronic device according to the second embodiment of the present invention.
Figure 6:
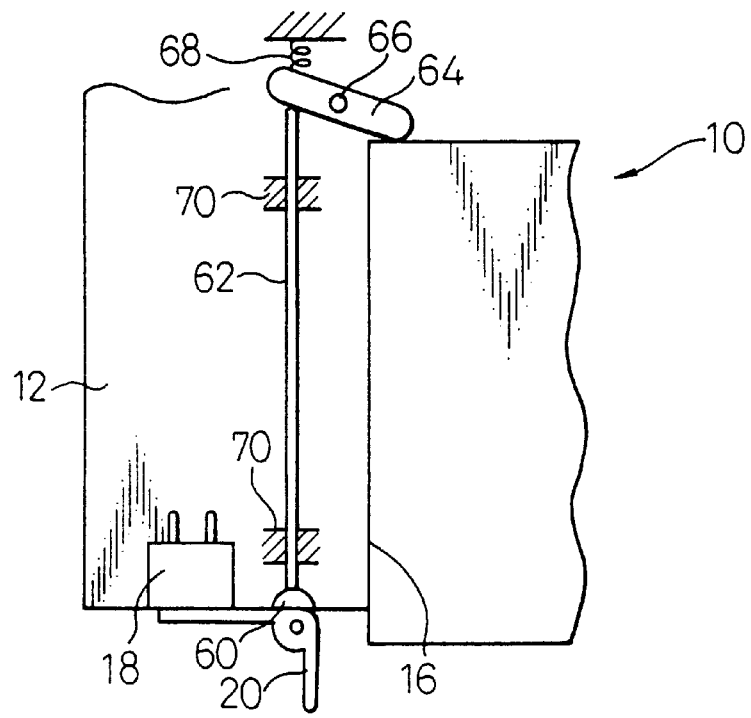
FIG. 6 is a diagrammatic view illustrating the electronic device of FIG. 5 when the electronic package is to be discharged.

FIGS. 5 and 6 illustrate another embodiment of the present invention. In this embodiment too, the electronic device 10 has the casing 12 which is provided with the insertion port 16 and the power input inlet 18. The protection member 20, similar to that in the previous embodiment, is disposed between the insertion port 16 and the power input inlet 18. The protection member 20 comprises a first portion 24 blocking the insertion port 18, a second portion 26 at least partly blocking the power input inlet 16, and a pivotable support portion 28 between the first portion 24 and the second portion 26. The electronic device 10 may further include the closure 30 similar to that of the above-mentioned embodiment. Therefore, the operation for inserting the electronic package 40 in the electronic device 10 or for taking it out, is substantially the same as that of the above-mentioned embodiment.

In this embodiment, the electronic device 10 further has a mechanism for discharging the electronic package 40 from the case 12 when the protection member 20 is moved from the second position to the first position. This mechanism comprises a cam 60 provided on the outer periphery of a corner of the protection member 20, a rod 62, and a lever 64. The rod 62 comes at its one end into contact with the cam 60 and comes at its other end into contact with the lever 64. The lever 64 is supported to pivot about a fulcrum 66, and the rod 62 is urged by a spring 68 in a direction to come into contact with the cam 60. Therefore, the rod 62 follows the cam 60 irrespective of its direction of rotation. The rod 62 is further supported by a bearing 70 to slide in the vertical direction in the drawing.

FIG. 5 illustrates that the electronic package 40 is inserted in the electronic device 10. The protection member 20 blocks the inlet port 16 in which the electronic package 40 is inserted, holds the back surface of the electronic package 40 and, further, opens the inlet 18. Therefore, the power input cord (not shown) is allowed to be fitted into the inlet 18, and the plug (see FIG. 4, of the power input cord inhibits the protection member 20 from moving from the second position to the first position. In this case, the lower part of the cam 60 comes into contact with the rod 62, and the lever 64 comes into contact with the front surface of the electronic package 40 at the most back position.

FIG. 6 illustrates that the electronic package 40 is taken out from the electronic device 10. When the power input cord (not shown) is pulled out from the inlet 18, it is allowed to move the protection member 20 from the second position to the first position. As the protection member 20 is turned in the clockwise direction from the state of FIG. 5, the cam 60 turns in the same direction, whereby the rod 62 moves in the axial direction thereof and the lever 64 turns in the clockwise direction in FIG. 6. As a result, the electronic package 40 is automatically discharged.

According to this embodiment, as described above, it is not allowed to remove the electronic package 40 unless the power input cord 50 is disconnected from the electronic device 10. Moreover, when the protection member 20 is moved to the first position, the electronic package 40 can be automatically discharged from the electronic device 10.

According to the present invention, as described above, it is not allowed to remove or mount the electronic package unless the power input cord is disconnected from the electronic device. Therefore, the electronic package is prevented from being damaged when the electronic package is mounted or is removed in a state of being supplied with electric power.

I claim:

1. An electronic device comprising a casing, an insertion port through which an electronic package is inserted in said casing, a power input inlet provided in said casing for connection to a power input cord, and a protection member movable between a first position in which it opens said insertion port and blocks said inlet and a second position in which it blocks said insertion port and opens said inlet.

2. An electronic device, according to claim 1, wherein, when a plug connected to the power input cord is permitted to be fitted in said power input inlet said protection member is at said second position, and said protection member is inhibited from moving from said second position to said first position by said fitted plug.

3. An electronic device, according to claim 1, wherein said casing has a surface to which said insertion port and said power input inlet are opening, and said protection member is arranged on said surface and is pivotable about a first axis substantially perpendicular to a line connecting the center of said insertion port to the center of said power input inlet.

4. An electronic device, according to claim 3, wherein said protection member is formed as an angular member comprising a first portion capable of blocking said insertion port, a second portion capable of blocking said power input inlet, and a pivotable support portion located between said first portion and said second portion for pivotally supporting said protection member about said first axis.

5. An electronic device, according to claim 3, further comprising a closure which is pivotable about a second axis perpendicular to said first axis, and is able to open or close said insertion port.

6. An electronic device, according to claim 5, wherein said closure has a projection that comes into contact with said protection member, and said projection inhibits said protection member from moving from said first position to said second position when said closure is closing said insertion port and permits said protection member to move from said first position to said second position when said closure is opening said insertion port.

7. An electronic device according to claim 1, further comprising a mechanism for discharging the electronic package from said case when said protection member is moved from said second position to said first position.

8. A device comprising a casing having a surface, a first opening provided in the surface of said casing, a second opening provided in the surface of said casing, a protection member movable between a first position in which it opens said first openings and blocks said second opening and a second position in which it blocks said first opening and opens said second opening, and a closure capable of opening or closing said first opening.

9. A device having a casing comprising:

a first opening;

a second opening;

a first cover movable between an opening position in which said first said opening is opened and a closing position in which first opening is closed;

a second cover movable between an opening position in which said second opening is opened and a closing position in which said second opening is closed;

said second cover being movable to the opening or closing position when said first cover is in the opening position, said second cover being locked by said first cover when said first cover is in the closing position; and said first opening and said second opening being arranged side by side in the same surface of the casing.

10. A device having a casing comprising:

a first opening provided in a surface of the casing;

a second opening provided in a surface of the casing;

a first cover rotatable about a first axis to cover said first opening;

a second cover rotatable about a second axis to cover said second opening;

said first cover having a first surface covering said first opening and a second surface arranged substantially perpendicular to said first surface;

said second cover having a third surface covering said second opening and a fourth surface arranged substantially perpendicular to said third surface; and the opening and closing movement of said second cover being restricted by said fourth surface in abutment with said second surface while said first and second cover are closed, and said second cover being movable to open and close when said first cover is opened.

11. A device having a casing comprising:

a first opening provided in a surface of the casing;

a second opening provided in a surface of the casing;

a first cover rotatable about a first axis to cover said first opening;

a second cover rotatable about a second axis to cover said second opening;

said first cover having a first surface covering said first opening;

said second cover having a second surface covering said second opening and a third surface arranged substantially perpendicular to said second surface; and said first cover being restricted to rotate from its opening position to the closed position by said third surface in abutment with said first cover while said second cover is opened, said first cover being rotatable when said second cover is closed.

12. A device having a casing comprising:

a first opening though which a component to be releasably attached to the device is inserted;

a second opening in which a power supply cord to supply power to the device is inserted;

a first cover rotatable about a first axis to cover said first opening;

a second cover rotatable about a second axis to cover said second opening;

said first cover having a first surface covering said first opening;

said second cover having a second surface covering said second opening and a third surface arranged to stand relative to said second surface;

the rotation of said second cover to the closed position being restricted by said third surface in abutment with said power supply cord when said power supply cord is inserted in said second opening; and said first cover being restricted to rotate from its opening position to the closed position by said third surface in abutment with said first cover while said second cover is opened, said first cover being rotatable when said second cover is closed.

13. A device having a casing comprising:

a first opening provided in a surface of the casing;

a second opening provided in a side by side relationship with said first opening;

a cover rotatable about a rotation axis and having a first surface and a second surface substantially perpendicular to said first surface;

wherein said cover is constructed such that said first opening is covered by said first surface and said second opening is opened in the first condition, and said second opening is covered by said second surface and said first opening is opened in the second condition.

14. A device according to claim 13, wherein a component to be releasably attached to the device is inserted in said first opening; and a member to push the rear end of the component when said cover rotates from the first condition to the second condition is provided.

* * * * *